United States Patent
Schwind et al.

(10) Patent No.: US 6,798,126 B2
(45) Date of Patent: Sep. 28, 2004

(54) HIGH ANGULAR INTENSITY SCHOTTKY ELECTRON POINT SOURCE

(75) Inventors: Gregory A. Schwind, Portland, OR (US); David S. Jun, Portland, OR (US); Gerald G. Magera, Portland, OR (US)

(73) Assignee: FEI Company, Hillsboro, OR (US)

( * ) Notice: Subject to any disclaimer, the term of this patent is extended or adjusted under 35 U.S.C. 154(b) by 12 days.

(21) Appl. No.: 10/138,708

(22) Filed: May 3, 2002

(65) Prior Publication Data

US 2003/0205958 A1 Nov. 6, 2003

(51) Int. Cl.[7] .............................. H01J 1/14; H01J 19/08; H01J 9/02; H01J 9/00
(52) U.S. Cl. .................. 313/309; 313/336; 313/311; 313/346 R; 313/351; 445/50; 445/51
(58) Field of Search .................. 445/50, 51; 313/309, 313/311, 346 R, 336, 351

(56) References Cited

U.S. PATENT DOCUMENTS

| 5,449,968 | A | * | 9/1995 | Terui et al. | 313/362.1 |
| 5,616,926 | A | * | 4/1997 | Shinada et al. | 250/423 F |
| 5,763,880 | A | | 6/1998 | Nisiyama et al. | 250/310 |
| 5,834,781 | A | * | 11/1998 | Fukuhara | 250/423 F |
| 5,838,096 | A | | 11/1998 | Shinada et al. | 313/336 |
| 6,133,679 | A | | 10/2000 | Terui et al. | 313/346 |

* cited by examiner

Primary Examiner—Ashok Patel
Assistant Examiner—Mariceli Santiago
(74) Attorney, Agent, or Firm—Michael O. Scheinberg

(57) ABSTRACT

An electron emitter is produced by applying a work function lowering material that does not require an extensive heating step before the material will function to lower the work function. By eliminating the extensive heating step, a small radius, highly tapered emitter tip will retain its shape to consistently produce a high angular intensity at a reasonable output power level.

41 Claims, 8 Drawing Sheets

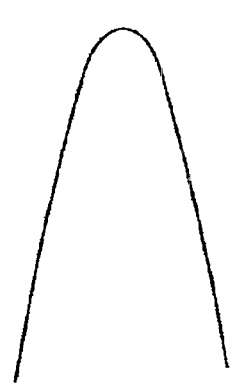 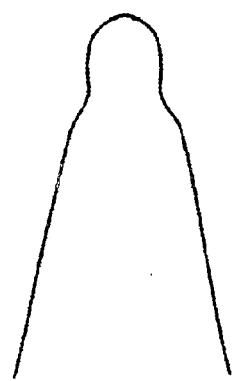
FIG. 6A FIG. 6B
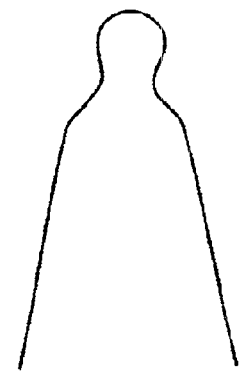 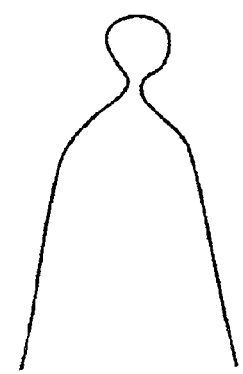
FIG. 6C FIG. 6D
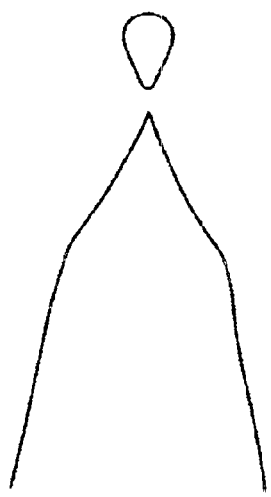 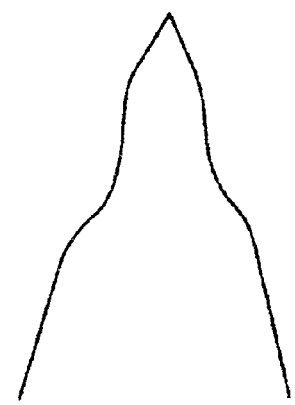
FIG. 6E FIG. 6F

HIGH ANGULAR INTENSITY SCHOTTKY ELECTRON POINT SOURCE

TECHNICAL FIELD OF THE INVENTION

The present invention relates to the field of electron emitters and in particular to a Schottky electron emitter having high transmission.

BACKGROUND OF THE INVENTION

Focused electrons beams are used in many applications, for observing and processing microscopic features. Electrons are emitted from an electron source and then formed into a beam by electron optical elements, which are analogous to optical elements used for light but use electric or magnetic fields instead of curved glass surfaces. Electrons in the beam impact a workpiece and can induce charges in the workpiece of the point of impact. The beam also causes secondary electrons to be emitted from the workpiece at the point of impact and the secondary electrons can be collected and used to form an image of the work piece.

The number of electrons in the beam passing a particular point each second is referred to as the beam current. There are some focused electron beam ("e-beam") applications, such as e-beam lithography and defect detection, in which very high beam currents are desirable. High beam currents result in significant increases in throughput, that is, the number of work pieces that can be processed in a given time period. Significant increases in throughput are desirable for present generation of e-beam tools and such increases will be a necessity for subsequent generations of electron beam tools.

An ideal, high current electron source would emit a large number of electrons, all having approximately the same energy, into a small angle cone around the optical axis. The number, angle, and energy of the electrons from an ideal source would remain stable over a long period of time. Real electron sources, however, emit electrons at various angles to the optical axis. The electron optics can only converge into the beam electrons that are emitted within a small cone around the optical axis into the beam, so not all of the electrons that are emitted end up as part of the beam. The electrons that are not transmitted in the beam add to the power consumption of the system without being useful. The ratio of the electron current in the beam to the total electron current that is produced by the emitter is referred to as the "transmission" of the emitter and is typically a few thousandths.

Transmission can be improved by concentrating the electron emission into a small solid angle around the beam axis. One common measurement of the angular concentration of electrons from a source is its angular intensity, I', defined as the number of electrons emitted per second per solid angle, typically measured in milliamperes per steradian (mA/sr). The angular intensity thus reflects not only the number of electrons emitted, but also the angular concentration of the electrons.

The most common high angular intensity electron source currently used in fine focus applications is a Schottky emitter. A Schottky emitter emits electrons from an emitter tip typically composed of tungsten and coated with zirconium and oxygen. The zirconium and oxygen reduce the amount of energy, referred to as the "work function," required to extract electrons from the emitter tip surface. The energy to extract electrons is provided in part by an electron current that heats the tip and in part by an electric field, referred to an extractor field, that provides additional energy to pull the electrons from the heated tip. Schottky emitters provide low energy spread, high stability, low noise, and long life. The conventional Schottky emitter in modem commercial systems typically operates at a maximum angular intensity of 1.0 mA/sr.

As shown in FIG. 1, the angular intensity of a modern Schottky source can be increased by increasing the total number of electrons emitted, for example by increasing the extraction field, which exponentially increases the number of electrons emitted. As shown in FIG. 2, however, the transmission decreases as the extraction current field is increased. Together, FIGS. 1 and 2 show that increasing the extraction field causes more electrons to be emitted, but a decreasing percentage of those additional electrons actually are in the central electron beam. Thus, the increased angular intensity comes at a cost of reduced efficiency.

The total emission current determines the maximum angular intensity that is practically achievable in a reliable emitter because it limits the maximum angular intensity at which the emitter can practically be operated. Because the power generated by the source is equal to the exponentially increasing emission current multiplied by the extraction voltage, the power generated increases exponentially along with the total emission current. It is preferable to have the total emission current below 750 $\mu$A as excess current and/or power may have a detrimental effect, on the performance and stability of the electron column. Therefore, to operate at high angular intensity it is necessary to have a high transmission.

Traditionally the method to increase transmission for a Schottky emitter (of approximately the same cone angle) is to increase the radius of the emitter tip. FIG. 3 shows a graph of transmission versus the radius of the emitter tip. FIG. 3 shows that the transmission can be maximized by using a radius of approximately 1.1 $\mu$m. Because the transmission peaks at about 1.1 $\mu$m, increasing or decreasing the radius of a conventional Schottky emitter cannot further increase the transmission. Thus the conventional Schottky emitter source is limited, even with the radius optimized, to a total angular intensity of less than about 1.4 mA/sr.

Currently there are commercially available Zr/O/W Schottky emitters with high transmission. These high transmission sources are similar to conventional Schottky emitters, but differ in the shape of the tip and perhaps in the Zr/O coverage. The Zr/O coverage differences are difficult to determine, but affect the work function. A conventional Schottky emitter tip, as shown in FIG. 4, is typically produced by electrochemically etching with alternating current to produce an emitter tip with an end radius of between 0.3 $\mu$m and 2.0 $\mu$m and a cone angle of 17 to 25 degrees. U.S. Pat. No. 5,449,968 to Terui et al. for a "Thermal Field Emission Cathode" describes a typical process for producing a conventional Schottky emitter.

A typical commercially available high transmission source has a shape characteristic of a direct current electrochemical etch with end radius of less than 0.5 $\mu$m and cone angle between 11 and 20 degrees. The combination of a long narrower cone angle and small radius results in a higher field strength at the tip of the emitter and smaller emission area than the conventional Schottky emitter source for a given extraction voltage and tip geometry. The localized high field and small emission area result in these emitters operating with transmissions several times greater than a conventional Schottky emitter source. Some commercially available emitters claim to have an angular intensity of up to 8.0 mA/sr with total currents of less than 600 μA, although applicants were unable to produce these high angular intensity levels using commercial available sources at the total current levels claimed by their manufacturers.

Moreover, the commercially available high angular intensity emitters have been found to be extremely inconsistent in their emission characteristics. The extreme inconsistency causes these emitters to typically operate, not with high transmission, but with transmission similar to a conventional Schottky emitter source. Even the emitters that do have high transmission often have other problems, including fluctuations in the beam current and/or total current, short term instability of the currents over a period of hours, long term drift of the currents over a period of days, and asymmetrical angular emission distribution. The significant inconsistency in transmission combined with the significant and frequent performance problems of the emitters that do have high transmission, makes the currently available commercial high I' emitters unpractical for use in a commercial focused e-beam system.

SUMMARY OF THE INVENTION

An object of the invention is to provide a process for producing an electron source having an accurately produced tip shape and suitable work function.

Another object of the invention is to provide an electron emitter having an accurately produced tip shape and suitable work function.

Another object of the invention is to provide an electron beam system using an electron emitter having an accurately produced tip shape and suitable work function.

The invention provides a method of producing electron sources, electron sources produced thereby, electron beam instruments using such sources, electron sources produced thereby, and a method of producing electron beam instruments using such sources. Applicants have found that a cause of problems in prior art electron sources is inconsistent emitter geometry and work function, often caused during the manufacturing step that lowers the work function of the emitter tip surface. By using a tip shaping process that produces a tip having desirable geometric characteristics and a work function lowering step that does not degrade the tip geometry, applicants produce an improved electron source.

In a preferred embodiment, applicants produce the desired emitter tip geometry by electroetching the tip, depositing a work function lowering material on the emitter, and then diffusing the work function lowering material to emitter tip. The prior art required an extended heating cycle to induce a chemical change in the deposited material before it would function as a work function lowering material. In the preferred embodiment, the deposited material is heated primarily to diffuse it to the emitter tip and not primarily to induce a chemical change, thereby reducing the duration and/or temperature of the heating step and consequently the alteration of the emitter tip geometry. The diffusion step is optionally performed with an electric field applied to the emitter tip, which field further reduces deformation of the tip geometry during heating.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and the advantages thereof, reference is now made to the following descriptions taken in conjunction with the accompanying drawings, in which:

FIGS. 6A through 6F show the progression of changes that a prior art emitter tip undergoes during an extended heating cycle to form the low work function surface.

DETAILED DESCRIPTION OF THE PREFERRED EMBODIMENTS

Figure 1:
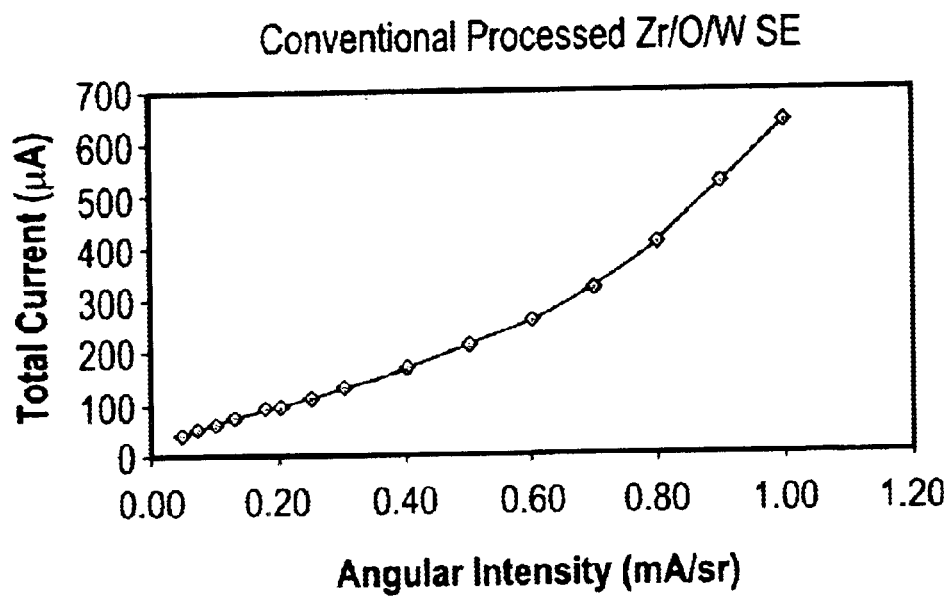
FIG. 1 is a graph showing the relationship between the angular current intensity and total current for a conventionally made zirconium/oxygen/tungsten Schottky emission electron source.
Figure 2:
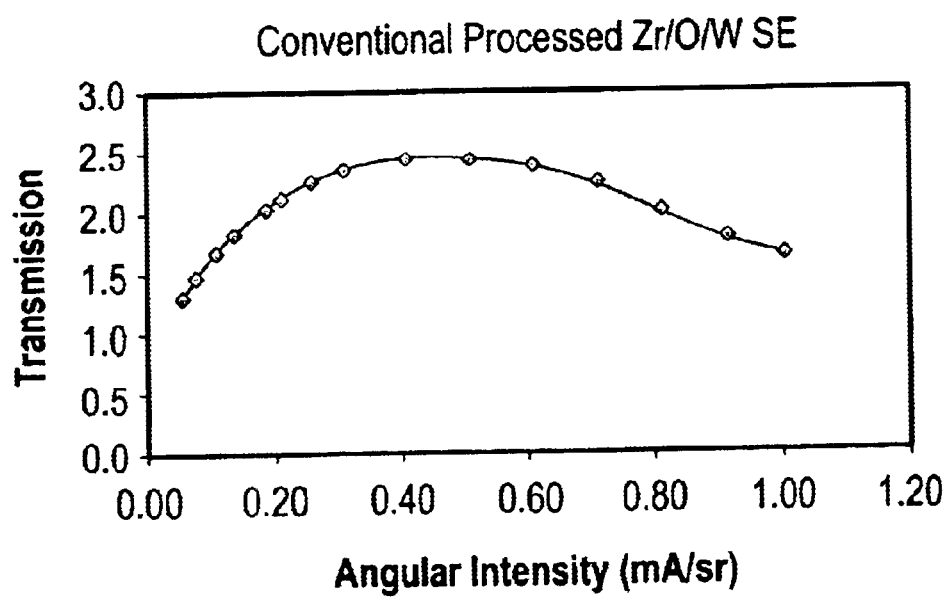
FIG. 2 is a graph showing the relationship between the angular current intensity and the transmission for a conventionally made zirconium/oxygen/tungsten Schottky emission electron source.
Figure 3:
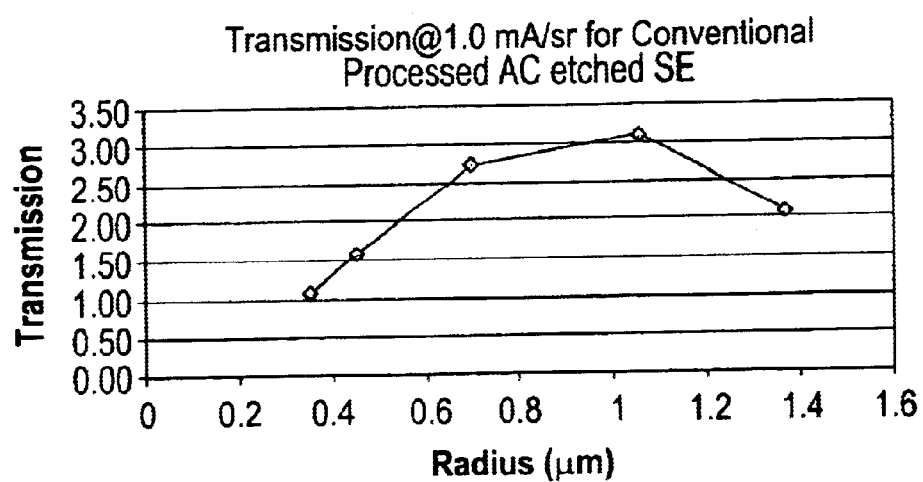
FIG. 3 is a graph showing the relationship between the emitter tip radius and the transmission for a conventionally made zirconium/oxygen/tungsten Schottky emission electron source.
Figure 4A:
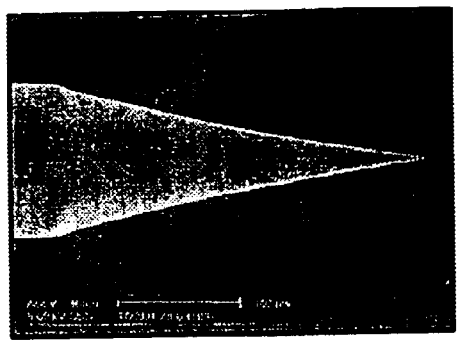
FIG. 4A is a micrograph of typical end form geometry for a conventionally made zirconium/oxygen/tungsten Schottky emission electron source.
Figure 4B:
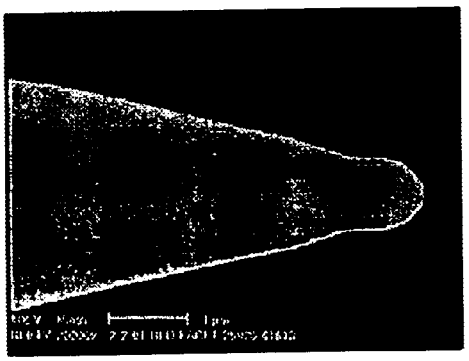
FIG. 4B shows the tip of FIG. 4A at greater magnification.
Figure 5A:
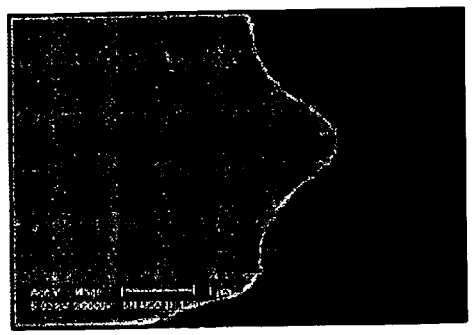
FIGS. 5A–5D are micrographs showing the great variation in end form geometry of typical commercially available high angular intensity zirconium/oxygen/tungsten Schottky emission electron sources.
Figure 5C:
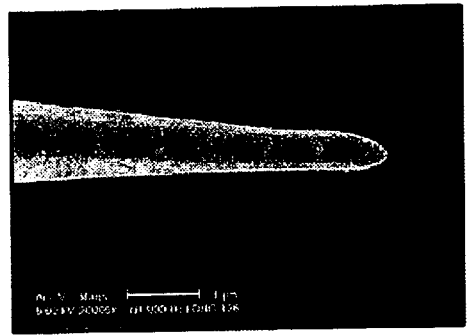
Figure 5B:
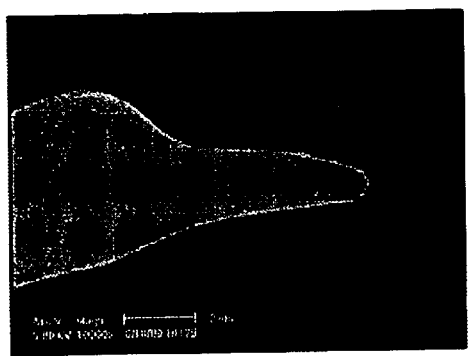
Figure 5D:
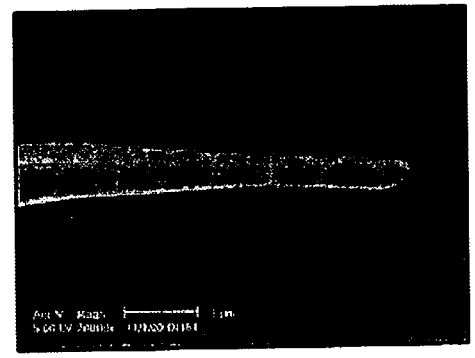

Applicants have found that many of the problems with high current electron emitters derive from inconsistent shapes and work functions at the emitter tip. Applicants have found that the emitter tips in commercially available emitters vary greatly in radius, symmetry, shape, and cone angle. FIG. 5A through FIG. 5D are photomicrographs showing at high magnification the variations found in a sampling of commercially available, high angular intensity emitters. Unlike conventional Schottky emitters, the tips of these high angular intensity emitters vary in shape from rounded to pointed. Each different end form has drastically different emission characteristics.

In some cases, even emitters having similar end forms exhibit drastically different emission characteristics. Applicants attribute these variations to differences in the work function, probably caused by inconsistent Zr/O coverage, perhaps because of the tip geometry. These inconsistencies result in inconsistent performance from emitter to emitter and also frustrate attempts to optimize the shape and/or radius to maximize performance.

Applicants have recognized that a primary reason for the inconsistency in shape is because conventional Schottky emitter processing methods have difficulty producing an emitter having a small radius, that is, less than about 0.30 $\mu$m, and small cone angle, that is, less than about 10 degrees. The conventional Schottky emitter source is typically made by application of reservoir of ZrH or pure Zr to the shank of the emitter or to the filament apex. If ZrH is applied, it is first reduced to Zr by heating the emitter in vacuum. The emitter is then heated in a partial pressure of oxygen for many hours to form Zr-oxide in the reservoir and, at the same time, the Zr diffuses over the emitter surface to coat the tip. U.S. Pat. No. 5,449,968 to Terui et al. for example, describes heating the emitter at between 1,200° C. and 1,500° C. for 20 hours at a partial pressure of oxygen of $1 \times 10^{-7}$ Torr. Some conventional processes heat the emitter for 40 hours. Terui et al. also describes in one embodiment adding some $ZO_2$ to the ZrH, but still uses an extended heating cycle at high temperature to oxidize the remaining zirconium.

During prolonged exposure to oxygen at high temperature, there is substantial bulk diffusion of substrate material in the tip region. The bulk diffusion can significantly change the shape of the tip. For the conventional alternating current etched Schottky emitter with a cone angle of between 17 and 25 degrees and a radius of between 0.3 $\mu$m and 1.0 $\mu$m, both necking and some radius reduction is observed. However for an etched emitter tip with a long narrow cone angle and small radius, the shape changes are typically more significant due to the significantly lower volume of material at the tip. FIGS. 6A–6F shows a sequence of deformation by necking during an extended heating cycle of an emitter tip having a narrow cone angle and small radius. In the extreme case, the neck area becomes too narrow to support the tip of the emitter and the tip breaks off (as shown in FIG. 6E), often resulting in a pointed or irregularly shaped tip (FIG. 6F). Even in the less extreme cases, in which the deformation only progresses to the shapes shown in FIGS. 6B and 6C, the shape and cone angle of the tip varies significantly from its starting form. The amount of material that moves and the migration rate is unpredictable and is extremely sensitive to the starting tip shape, the temperature of the tip, and the partial pressure of $O_2$ during processing.

In a conventional process for making Schottky emitters, the emitters undergo a "faceting" process in which a flat, square spot is formed at the end of the emitter, to expose a (100) crystal plane from which the electrons are emitted. The emitter exhibits a square emission pattern when displayed on a phosphor screen. The flat spot on the emitter end contributes to the uniform and consistent emission from the source and ensures that the emission is along the optical axis. An additional problem observed with prior art commercially available high angular intensity sources is that the emitter end does not always form a consistent, flat (100) facet on the tip. Some high angular intensity emission tips form a flat spot, and others retain a rounded end form. The lack of a square, flat facet often results in significant electron emission that is not along the optical axis and therefore not incorporated into the central beam.

As described above, the conventional method for making an emitter comprises first forming an emitter of the desired shape, and then processing the formed emitter to lower its work function. The work function lowering process typically entails maintaining the emitter at a high temperature in a rather high partial pressure of oxygen for a long period of time, which alters the shape of the emitter in a way that degrades its emission characteristics in an unpredictable way. The extended heating cycle is required to chemically combine the zirconium in the reservoir with gaseous oxygen in the vacuum chamber. The emitter will not form the low work function of the tip unless it combines with oxygen.

The present invention substantially removes the influence of the work function lowering process on the tip geometry so that the tip can maintain a desired shape. In accordance with a preferred method of the invention embodiment of the invention, a $ZrO_2$ reservoir is applied in the form of slurry to the shank emitter. The emitter is then heated in a vacuum and the Zr and O diffuse to the tip and form a low work function surface in a few hours or less. It was found that after forming an emitter using an electroetching method, the necking and shape changes that occur in the conventional oxygen exposure step of the process did not occur when the inventive process was used.

Figure 7A:
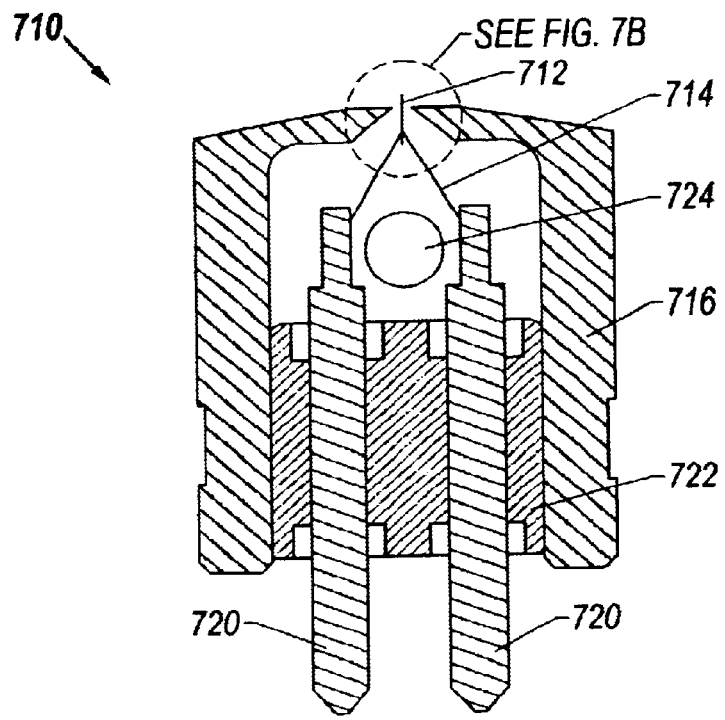
FIG. 7A shows a typical Schottky emitter.
Figure 7B:
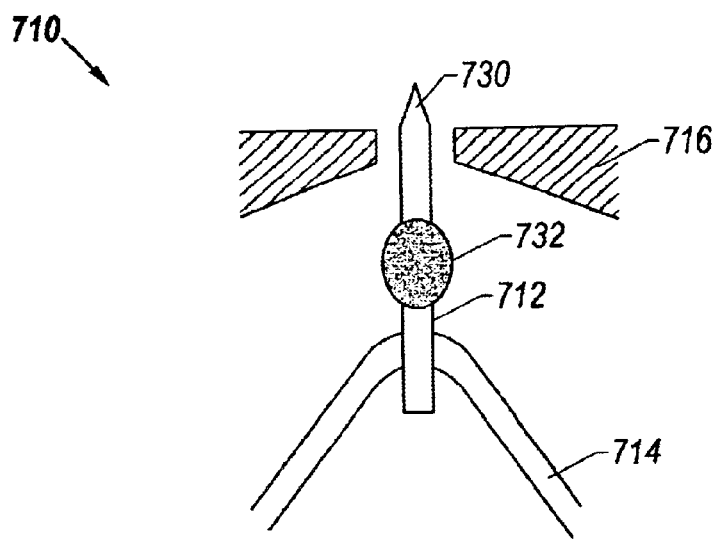
FIG. 7B shows the enlarged emitter tip of the Schottky emitter of FIG. 7A.

FIG. 7A shows a typical Schottky emitter 710 made in accordance with the present invention. FIG. 7B is a detail view of a part of FIG. 7A. Schottky emitter 710 looks similar to an emitter made by conventional methods, but the tip geometry is more precise and more consistent from emitter to emitter. Schottky emitter 710 comprises a single crystal tungsten emitter 712 that is coated with zirconium and oxygen, a filament 714 that supports and heats the emitter 712, a suppressor cap 716 that reduces emission from the side of the emitter 712, electrodes 720 that supply current for heating the filament and supply the electrons for emission, and an insulator 722 that holds the electrodes and supports suppressor cap 716. Pumping holes 724 (one shown) facilitate the evacuation of gases from within the area surrounding the Schottky emitter. FIG. 7B shows that the emitter 710 includes and emitter tip 730 and a reservoir 732 of zirconium and oxygen for resupplying those elements to emitter tip 730, as they are lost from the tip through evaporation. To operate the source, sufficient current is applied to the filament to heat the emitter to an elevated temperature, typically 1800 K, and then a high electric field, is applied to the emitter in vacuum which results in the emission of electrons. A high transmission Schottky emitter fabricated in accordance with one embodiment of the invention will operate at high angular intensities of between 2 mA/sr and 6 mA/sr with a total current of less than 750 $\mu$A and more preferably at a total current of less than 650 $\mu$A. Other high transmission Schottky emitter fabricated in accordance with one embodiment of the invention will operate at high angular intensities of greater than 1 mA/sr or greater than 1.5 mA/sr, typically with a total current of less than 750 $\mu$A or more preferably less than 650 $\mu$A. The invention is not limited to any particular upper value for the angular intensity.

Figure 8:
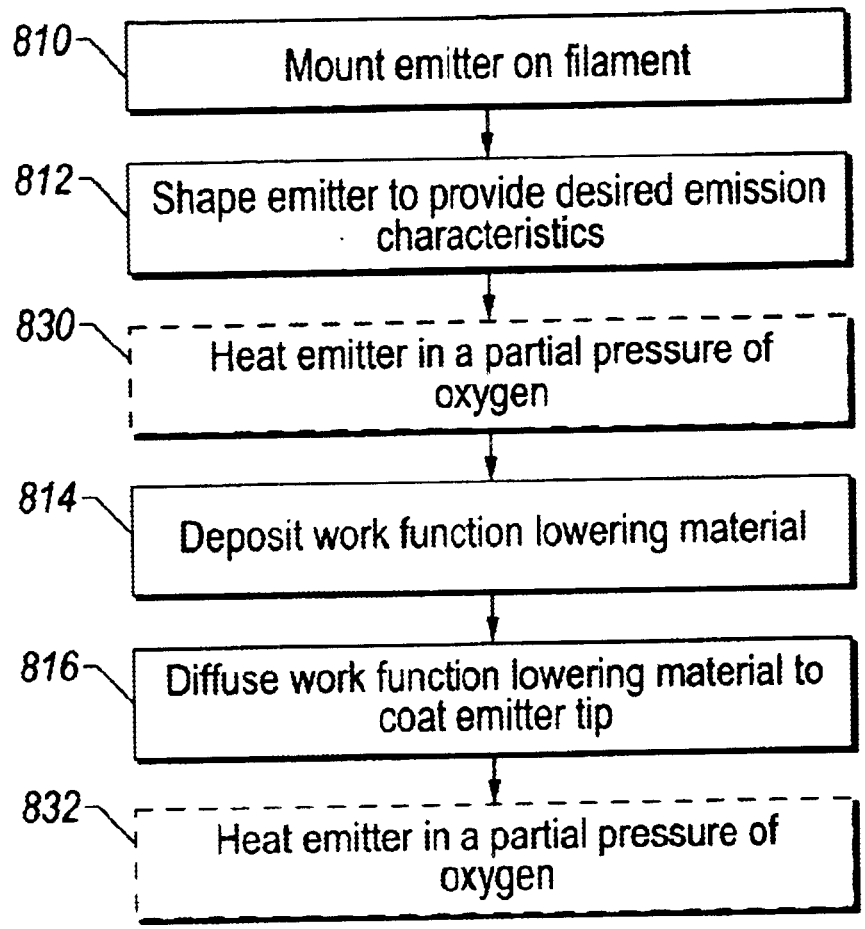
FIG. 8 is a flow chart showing the steps of fabricating a preferred Schottky emitter embodying in the present invention

FIG. 8 is a flow chart showing the steps of a preferred method of fabricating a Schottky emitter embodying the invention. In step 810, a single crystal W<100> tungsten emitter is mounted on a filament, preferably also of tungsten, for heating and support. In step 812, the emitter end is electrochemically etched, preferably using a direct current etching method, to form a radius of preferably less than 0.2 $\mu$m and cone angle of preferably less than 12 degrees. Alternatively, an alternating current etch method of using a loop method or emitter pull method, as taught in A. J. Melmed, "The Art And Science And Other Aspects Of Making Sharp Tips" Journal of Vacuum Science & Technology B: Microelectronics and Nanometer Structures, Vol. 9, Issue 2, pp. 601–608 (1991). In accordance with this method, the relative position of the loop to the emitter is adjusted, or the emitter is pulled from the etching solution as required during the etching to achieve a radius of preferably less than 0.2 μm and cone angle of preferably less than 12 degrees. In step 814, a small reservoir of $ZrO_2$ is deposited as slurry onto the shank of the emitter.

In step 816, the emitter shank and tip are heated to diffuse zirconium and oxygen from the reservoir to coat the emitter tip. Because the rate of diffusion of the zirconium and oxygen depends on the temperature of the emitter, the diffusion step can be done for a relatively long period at a relatively low temperature or more quickly at a higher temperature. The diffusion step is preferably, but not necessarily, performed with an extraction voltage applied to the emitter. The extraction voltage reduces the deformation of the emitter tip and with an extraction voltage applied, the emitter current characteristics can be observed to provide an indication when the diffusion process is complete. The emitter current is very low at the beginner of the diffusion step, but increases as the zirconium and oxygen diffuse to the emitter tip, reducing its work function. When the emitter current stabilizes at a relatively high level, the diffusion step is complete.

Diffusion step 816 is performed in a vacuum, preferably at an elevated temperature of greater than 1,400 K and more preferably between about 1,600 K and about 2,000 K. The emitter is preferably maintained at an elevated temperature for less than about 3 hours, more preferably for less than about 2 hours, and most preferably for less than about 1 hour. The time required for the zirconium and oxygen diffusion varies with the temperature. For example, diffusion takes about 60 minutes at about 1,800 K.

The preferred voltage to be applied to the emitter during step 816 will vary with the radius of the emitter tip. For example, for an emitter tip having a radius of about 0.5 μm, a voltage of about four or five kilovolt is typically used. For an emitter tip having a radius of about 1.0 μm, a typical voltage is about six kilovolt. The diffusion step is complete when the emitter current stabilizes at a high angular intensity, typically between 1 mA/sr and 6 mA/sr, with a total arm current of less than about 650 mA. The voltage applied should not be so high that the emitter current becomes excessive when the zirconium and oxygen diffuses, the tip work function lowers, and the current increases.

If a voltage is applied to the emitter during step 816, there are no detrimental effects from continuing to heat the emitter past the point when the work function is lowered. Therefore, the exact duration of the heating cycle is not critical as long as it is sufficiently long to diffuse the zirconium and oxygen. Even without a voltage applied, the diffusion step is typically short enough to prevent significant deformation of the tip geometry. After an approximate duration is determined for step 816 at particular temperature, emitters can be heated for the determined duration, and it is not necessary to monitor the current of each emitter processed to stop the process immediately after the work function is lowered.

Step 816 contrasts to the prior art step of heating the emitter in an oxygen environment to oxidize the zirconium. The oxygen environment precludes application of high voltage that prevents or reduces deformation of the tip. Moreover, deformation of the tip is reduced in step 816 because the diffusion step of the invention can be performed for a shorter duration and/or at a lower temperature than the oxidizing step required by the prior art method. The deformation occurring in a time period increases non-linearly with the temperature, so an extended heating at 1600 K produces much less deformation than a similar heating period at 1800 K.

The inventive method of forming the low work function surface allows the tip shape, including the radius and cone angle, to be maintained as formed in a previous process. Thus, a small radius and narrow cone angle can be maintained. The duration and temperature of the diffusion step is not critical, as long as the combination of temperature and duration suffices to diffuse the work function lowering material to coat the emitter tip, but does not deform the emitter tip to such an extent that the emission characteristics are significantly degraded.

It was found that step 810, 812, 814, and 816 produce, in most cases, emitters having uniformly shaped ends and consistently low work functions. A small number of emitters, however, were still unsatisfactory. Applicants believe that the small number of emitter failed because a proper work function lowering layer was not formed. Applicants have found that two additional, optional steps can be used, alone or together, to increase the fraction of emitters that perform satisfactorily.

In optional step 830, before the application of the $ZrO_2$ to the emitter shank, the emitter is heated, preferably to about 1,800 K for between about thirty minutes and about one hour in a vacuum with a small amount of oxygen leaked into the vacuum chamber to achieve a partial pressure of oxygen in the chamber between about $1\times10^{-9}$ Torr and about $2\times10^{-9}$ Torr. In optional step 832, the emitter tip is heated preferably to about 1700 K for about 10 minutes in a partial pressure of oxygen, typically between about $1\times10^{-8}$ Torr and about $1\times10^{-5}$ Torr, after the $ZrO_2$ was applied to the emitter shank and diffused. Either of steps 830 and 832 can be used alone, or both steps can be used.

Applicants found that inconsistencies in the work functions of the emitters can be eliminated by either or both of steps 830 or 832, that is, by either heating the emitter tip with a small amount of oxygen leaked into the vacuum chamber before applying a coating of $ZrO_2$ to the tip shank or after applying the $ZrO_2$ and diffusing it to coat the tip.

The emitter heating in optional steps 830 and 832 is typically performed without an electric field been applied, which can cause the emitter shape to change during this process step. The amount the emitter geometry change varies with the duration and temperature of the heating step. One can either lower the temperature or shorten the time to reduce or prevent significant geometric changes from occurring. Step 830 and 832 are performed in a low pressure environment, that is, a high vacuum environment, including oxygen, each for preferably less than two hours. A preferred duration for heating at about 1,800 K before application of $ZrO_2$ is less than about one hour and more preferably less than or equal to about thirty minutes. A preferred duration for heating after application of $ZrO_2$ is less than about thirty minutes and more preferably less than or equal to about ten minutes at about 1,700 K. The time and temperature should be minimized to reduce the effect on the tip geometry. Different times and temperatures can be used, and a skilled person can vary the time and temperature to produce desired emission characteristics and minimal change in geometry. If one desires to reduce or eliminate possible geometric shape changes caused by steps 830 and 832, the oxygen treatment steps can be eliminated at the risk that a small percentage of emitters may not form the lowest work function possible or the steps can be done with electric field applied, but the field must be kept low enough to prevent arcing.

This invention can provide a small radius and long narrow cone-shaped end form while still providing a low work function surface because the work function lowering process does not adversely affect the tip, shape. In a preferred embodiment, the work function of the emitter is lowered by applying $ZrO_2$ instead of the conventional method of applying Zr or ZrH and exposing the emitter to oxygen at high temperature for an extended period to oxidize the zirconium. By eliminating the long process for oxidizing the zirconium, and by using the $ZrO_2$ work function lowering processing step, the original etched small radius and narrow cone shape of the emitter is preserved, thereby, reducing or eliminating all shape changes during the low work function processing.

Figure 9A:
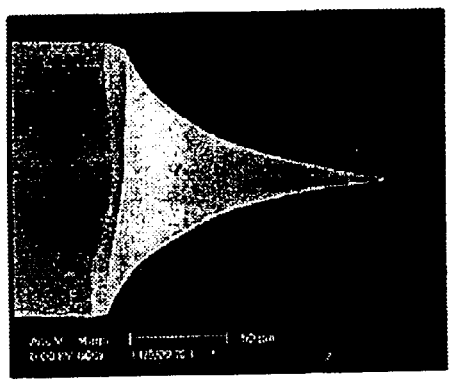
FIGS. 9A and 9B shows an emitter fabricated in accordance with the present invention.
Figure 9B:
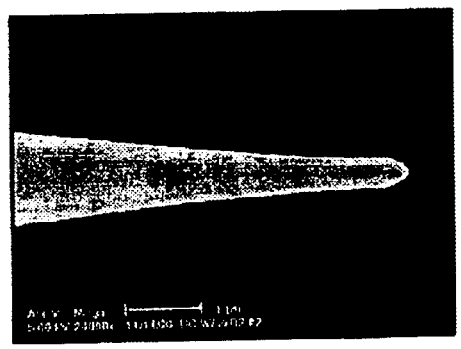

The work functions of emitters produced in accordance with the invention are consistent if the processing temperature and duration is sufficient for the Zr/O diffusion to reach completion. This invention thus solves the primary problem of inconsistent emitter performance, enabling the high angular intensity source to be used in commercial applications. The emitter shape can be easily controlled in the etching stage and, since the emitter shape is maintained from the etching stage to the final stage, the emitter can be shaped for optimum performance for a given application. The invention also solves the problems of inconsistent emission pattern and angular distribution because emitters made with this process form the desired flat facet on the tip of the emitter. FIGS. 9A and 9B show micrographs of an emitter formulated in accordance with the invention.

The invention effectively decouples the shape forming process from the work function forming process. Since the two processes are independent of each other, each can be controlled independently. This independence allows greater control of each of these critical processes and for effective optimization both of the process and of the final product of the process.

Figure 10:
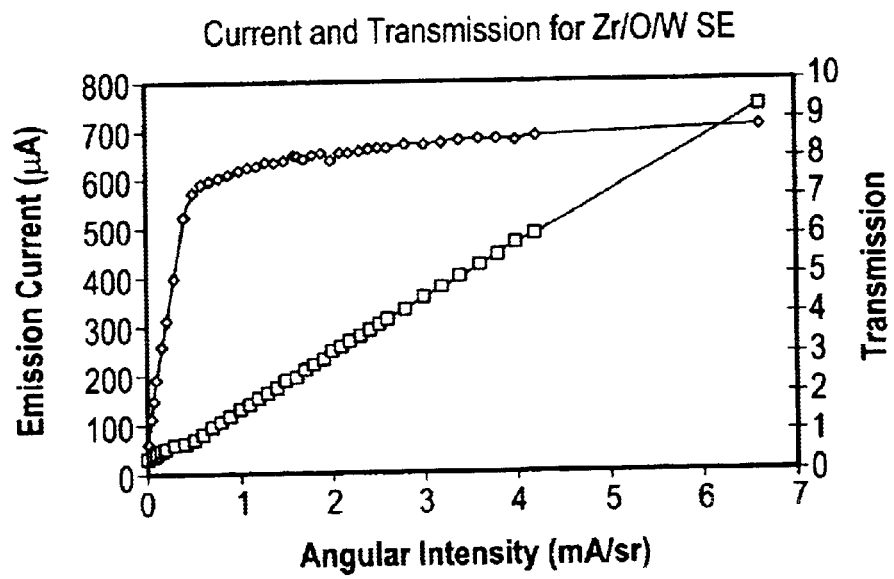
FIG. 10 is a graph showing the current and transmission for an emitter fabricated in accordance with the invention.

Combining a small radius and a narrow cone angle having a faceted end form with the $ZrO_2$ work function lowering method results in consistent high emitter transmission. The invention reduces or eliminates the problem of inconsistent emitter performance in currently available high angular intensity Schottky emitter sources. FIG. 10 shows the transmission and the emission current as functions of angular intensity for a Schottky emitter of the preferred embodiment described above.

Figure 11:
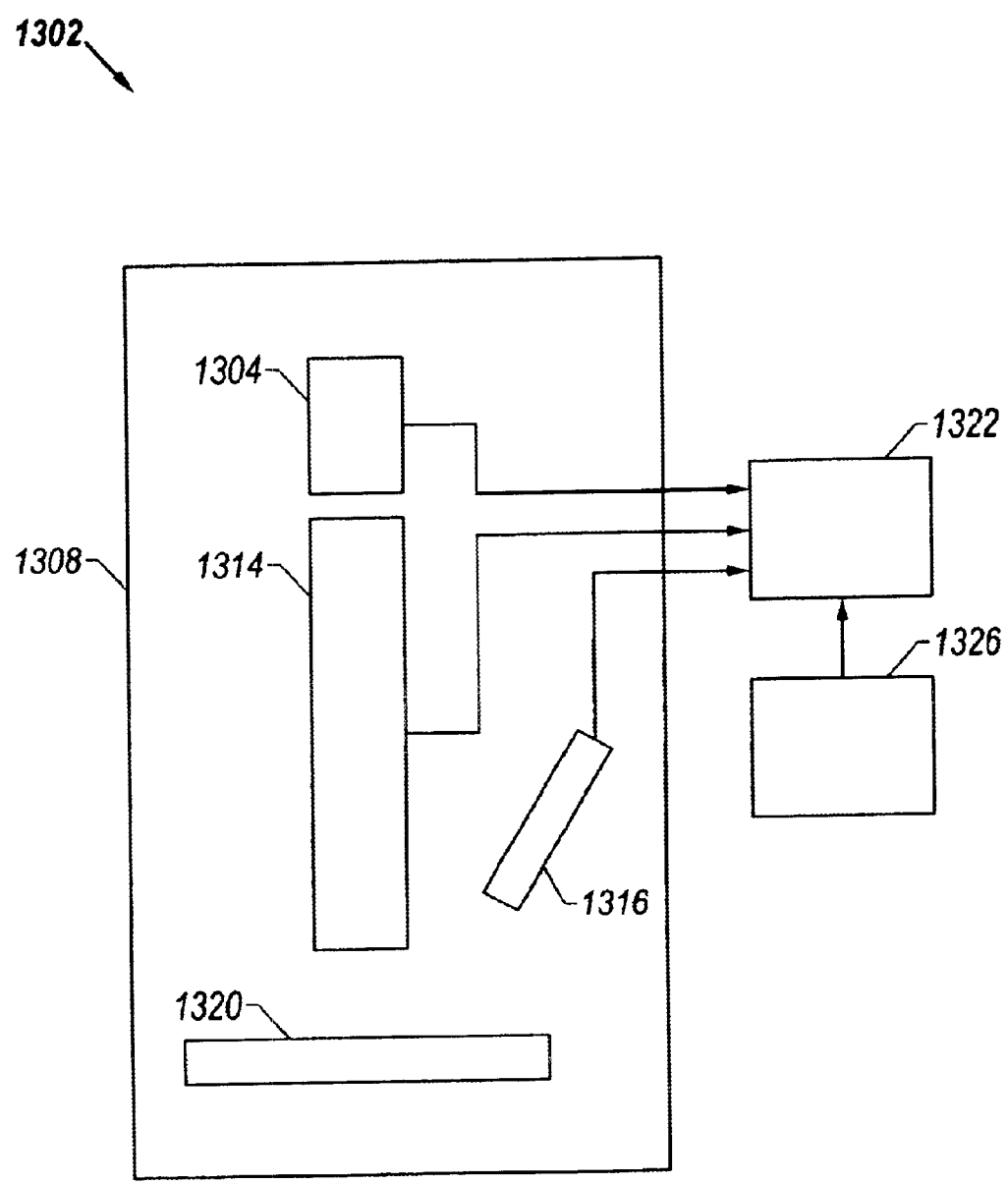
FIG. 11 shows an electron beam system incorporating an emitter in accordance with the present invention.

FIG. 11 shows a block diagram of an electron beam system 1302, such as an e-beam lithography or inspection system, that incorporates an emitter 1304 in accordance with the present invention. Emitter 1304 is maintained within a vacuum chamber 1308 that also includes an electron column 1314, a secondary particle detector 1316, and a target 1320. Controller 1322 controls the components in the system to direct an electron beam toward target 1320 and show the target on a display 1326 using secondary particles detected by detector 1316.

Although the invention was described using zirconium as the metal to form the low work function surface, the zirconium can be replaced with oxides of zirconium, hafnium, titanium, scandium, yttrium, vanadium or lanthanum, or nitride of zirconium, titanium, niobium, scandium, vanadium or lanthanum. These materials can be applied in a similar manner described above for zirconium to form a low work function surface.

Certain other improvements to Schottky emitters are described in co-pending U.S. patent application Ser. No. 09/639,451, filed Aug. 15, 2000, for a "Schottky Emitter Having Extended Life" and in U.S. patent application Ser. No. 09/981,663, filed Oct. 16, 2001, for a "Low Power Schottky Emitter," both of which are hereby incorporated by reference. Either or both of these improvements can be used together with the techniques of the present application.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of forming an electron emitter, comprising:
   providing an emitter including tungsten;
   electrochemically etching a tip on the emitter, the tip having an end radius of less than about 0.4 $\mu$m and cone angle of less than about 15 degrees;
   depositing a material comprising zirconium oxide on a portion of the emitter away from the tip; and
   heating the emitter sufficiently to diffuse zirconium oxide from the portion of the emitter away from the tip to the tip but not sufficiently to change the shape of the tip to the extent that emission characteristics are significantly degraded, electromechanically etching the tip on the emitter and heating the emitter sufficiently to diffuse zirconium oxide producing an emitter capable of producing greater that 1.5 mA/sr using a total emission current of less than 750 $\mu$A.

2. The method of claim 1 in which electrochemically etching a tip on the emitter and heating the emitter sufficiently to diffuse zirconium oxide includes producing an emitter capable of producing greater than 3 mA/sr using a total emission current of less than 750 $\mu$A.

3. An electron emitter fabricated in accordance with the steps of claim 1.

4. The electron emitter of claim 3 in which the emitter has an angular intensity of greater than about 2 mA/sr when using a total emission current of less than about 750 $\mu$A.

5. The method of claim 1 in which electrochemically etching a tip on the emitter and heating the emitter sufficiently to diffuse zirconium oxide includes producing an emitter that produced greater than 1.5 mA/sr using a total emission of less than 650 $\mu$A.

6. The method of claim 5 in which electrochemically etching a tip on the emitter and includes using a direct current to electro etch a tip having an end radius of less than 0.3 $\mu$m and cone angle of less than 15 degrees.

7. The method of claim 5 in which electrochemically etching a tip on the emitter includes using a direct current to electro etch a tip having an end radius of less than 0.2 $\mu$m and cone angle of less than 10 degrees.

8. The method of claim 5 in which heating the emitter sufficiently to diffuse zirconium oxide includes heating the emitter in a vacuum with an extraction voltage applied.

9. The method of claim 3 further comprising heating the emitter in a high vacuum environment including oxygen at a temperature of between 1,000 K and 1,900 K.

10. A method of forming an election emitter, comprising:
    providing an emitter including tungsten;

electrochemically etching tip on an emitter by using an alternating current or direct current and a movable loop or a movable emitter to tailor the shape of the emitter during the etching process to produce a emitter radius of less than 0.3 µm and cone angle of less than 15 degrees.

depositing a material comprising zirconium oxide on a portion of the emitter away from the tip; and heating the emitter sufficiently to diffuse zirconium oxide from the portion of the emitter away from the tip to the tip but not sufficiently to change the shape of the tip to the extent that emmission characteristics are significantly degraded.

11. A method of forming an electron emitter, comprising:

providing an emitter including tungsten;

electrochemically etching a tip on the emitter, the tip having an end radius of less than about 0.4 µm and cone angel of less than about 15 degrees;

depositing a material comprising zirconium oxide on a portion of the emitter away the tip; and heating the emitter to a temperature of greater than about 1,400 K for a period of less than about three hours so as to diffuse zirconium oxide from the portion of the emitter away from the tip to the tip but not to change the shape of the tip to the extent that emission characteristics are significantly degraded.

12. A method forming an electron emitter comprising:

providing an emitter including tungsten;

electrochemically etching a tip on the emitter, the tip having an end radius of less than about 0.4 µm and cone angel of less than about 15 degrees;

depositing a material comprising zirconium oxide on a portion of the emitter away from the tip; and heating the emitter at a temperature of between 1,000 K and 1,900 K in a high vacuum environment for less than two hours in a partial pressure of oxygen to diffuse zirconium oxide from the portion of the emitter away from the tip to the tip but not sufficiently to change the shape of the tip to the extent that emission characteristics are significantly degraded.

13. The method of claim 12 in which heating the emitter for less than two hours in a high vacuum environment including oxygen including heating the emitter after heating the emitter sufficiently to diffuse zirconium oxide from the portion of the emitter away from the tip to the tip.

14. The method of claim 12 in which heating the emitter for less than two hours in a high vacuum environment including oxygen including heating the emitter before heating the emitter sufficiently to diffuse zirconium oxide from the portion of the emitter away from the tip to the tip.

15. The method of claim 12 in which heating the emitter for less than two hours in a high vacuum environment including oxygen including heating the emitter before depositing a material comprising zirconium oxide.

16. A method of forming an electron emitter comprising:

providing an emitter;

forming a tip on the emitter, the tip having a radius sufficiently small to produce an angular intensity of greater than 1.0 mA/sr when coated with a work-function lowering material;

depositing on a portion of the emitter away from the tip a work function lowering material, the material not requiring an extended heating step to induce a chemical change in the material before it functions to lower the work function of a coated surface;

diffusing some of the work function lowering material from the portion of the emitter to the tip, thereby lowering the work function of the tip without an extended heating cycle that alters the shape of the tip sufficiently to degrade.

17. The method of claim 16 in which forming a tip on the emitter includes forming a tip having a radius and cone angle sufficiently small to produce an angular intensity of greater than 2 mA/sr when using a total emission current of less that 750 µA when coated with a work-function lowering material.

18. The method of claim 17 in which forming a tip on the emitter includes forming a tip having a radius and cone angle sufficiently small to produce an angular intensity of greater than 2 mA/sr when using a total emission current of less that 650 µA when coated with a work-function lowering material.

19. The method of claim 17 in which depositing a reservoir of a work function lowering material includes depositing zirconium oxide.

20. The method of claim 17 in which forming a tip on the emitter includes etching a tip having a radius of less than 0.4 µm.

21. The method of claim 20 in which forming a tip on the emitter includes etching a tip having a cone angle of less than fifteen degrees.

22. The method of claim 17 in which forming a tip on the emitter includes etching a tip having a cone angle of less than fifteen degrees.

23. The method of claim 17 in which depositing a work function lowering material includes depositing an oxide of hafnium, titanium, scandium, yttrium, vanadium or lanthanum, or nitride of zirconium, titanium, niobium, scandium, vanadium or lanthanum.

24. The method of claim 17 in which diffusing some of the work function lowering material from the portion of the emitter away from the tip to the tip includes heating the emitter in a vacuum with an extraction voltage applied.

25. The method of claim 24 in which heating the emitter in a vacuum includes heating the emitter to a temperature of greater than 1,400 K for less than five hours.

26. The method of claim 16 further comprising heating the emitter for less than two hours in a partial pressure of oxygen.

27. The method of claim 26 in which heating the emitter for less than two hours in a partial pressure of oxygen includes heating the emitter to a temperature of between about 1,000 K and about 1,900 K.

28. The method of claim 26 in which heating the emitter for less than two hours in a partial pressure of oxygen includes heating the emitter after the step of heating the emitter sufficiently to diffuse zirconium oxide from the portion of the emitter away from the tip to the tip.

29. The method of claim 26 in which heating the emitter for less than two hours in a partial pressure of oxygen includes heating the emitter before the step of heating the emitter sufficiently to diffuse zirconium oxide from the portion of the emitter away from the tip to the tip.

30. The method of claim 26 in which heating the emitter for less than two hours in a partial pressure of oxygen including heating the emitter before depositing a material comprising zirconium oxide.

31. An electron emitter fabricated in accordance the method of claim 17.

32. A method of forming a high angular intensity emitter tip comprising:

forming an emitter tip of a desired shape, the tip having a cone angle and radius sufficiently small to produce an angular intensity of greater than 1.0 mA/sr; and applying a work function lowering material to the tip without significantly changing the shape of the tip.

33. The method of claim 32 in which forming an emitter tip of a desired shape includes forming a tip having a cone angle and radius sufficiently small to produce an angular intensity of greater than 1.0 mA/sr at a total emission current of less than 750 μA.

34. The method of claim 33 in which forming an emitter tip of a desired shape includes forming a tip having a cone angle and radius sufficiently small to produce an angular intensity of greater than 1.0 mA/sr at a total emission current of less than 650 μA.

35. The method of claim 32 in which forming an emitter tip of a desired shape includes forming a tip having a radius of less than 0.4 micron and a cone angle of less than 15 degrees.

36. The method of claim 32 in which forming an emitter tip of a desired shape includes forming a tip having a radius of less than 0.2 micron and a cone angle of less than 10 degrees.

37. The method of claim 32 in which forming a tip on the emitter includes electrochemically etching a tungsten <100> crystal emitter to produce an end radius of about 0.3 mm or less and a cone angle of about 15 degrees or less.

38. The method of claim 32 in which applying a work function lowering material includes depositing an oxide of hafnium, titanium, scandium, yttrium, vanadium or lanthanum, or nitride of zirconium, titanium, niobium, scandium, vanadium or lanthanum.

39. The method of claim 32 in which applying a work function lowering material includes applying a material that does not require extended heating to induce a chemical change in the material before it will lower the work function of surface coated by the material.

40. An emitter formed in accordance with the method of claim 39.

41. An electron beam system comprising:
   an electron emitter formed in accordance with claim 40;
   an electron optical column for focusing into a beam electrons emitted by the electron emitter; and
   a secondary electron detector for detecting secondary electrons emitted upon impact of the electron beam.

* * * * *